US009437769B2

(12) United States Patent
Bi et al.

(10) Patent No.: US 9,437,769 B2
(45) Date of Patent: Sep. 6, 2016

(54) FOUR-JUNCTION QUATERNARY COMPOUND SOLAR CELL AND METHOD THEREOF

(71) Applicant: Xiamen Sanan Optoelectronics Technology Co., Ltd., Xiamen (CN)

(72) Inventors: Jingfeng Bi, Tianjin (CN); Guijiang Lin, Tianjin (CN); Jianqing Liu, Tianjin (CN); Weiping Xiong, Tianjin (CN); Minghui Song, Tianjin (CN); Liangjun Wang, Tianjin (CN); Jie Ding, Tianjin (CN); Zhidong Lin, Tianjin (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 176 days.

(21) Appl. No.: 14/374,006

(22) PCT Filed: Dec. 21, 2012

(86) PCT No.: PCT/CN2012/087150
§ 371 (c)(1),
(2) Date: Jul. 23, 2014

(87) PCT Pub. No.: WO2013/117108
PCT Pub. Date: Aug. 15, 2013

(65) Prior Publication Data
US 2014/0373907 A1    Dec. 25, 2014

(30) Foreign Application Priority Data
Feb. 8, 2012    (CN) .......................... 2012 1 0026736

(51) Int. Cl.
*H01L 31/0725*    (2012.01)
*H01L 31/0735*    (2012.01)
*H01L 31/18*    (2006.01)
*H01L 31/0304*    (2006.01)
*H01L 31/065*    (2012.01)
*H01L 31/054*    (2014.01)

(52) U.S. Cl.
CPC ..... *H01L 31/0725* (2013.01); *H01L 31/03046* (2013.01); *H01L 31/054* (2014.12); *H01L31/065* (2013.01); *H01L 31/0735* (2013.01); *H01L 31/18* (2013.01); *H01L 31/1844* (2013.01); *Y02E 10/52* (2013.01); *Y02E 10/544* (2013.01)

(58) Field of Classification Search
CPC ........... H01L 31/0725; H01L 31/0735; H01L 31/18; H01L 31/03046; H01L 31/065; H01L 31/1844; H01L 31/054
USPC ....................................................... 136/252
See application file for complete search history.

(56) References Cited

U.S. PATENT DOCUMENTS

2012/0240987 A1*    9/2012    King ............... H01L 31/035236
                                                                 136/255

FOREIGN PATENT DOCUMENTS

CN        102184980        9/2011
CN        102244134        11/2011
(Continued)

OTHER PUBLICATIONS

International Search Report for International Application No. PCT/CN2012/087150 "Four-Junction Quarternary Compound Solar Cell and Method Thereof", Date of Mailing: Mar. 28, 2013.
(Continued)

Primary Examiner — Jayne Mershon
(74) Attorney, Agent, or Firm — Syncoda LLC; Feng Ma; Junjie Feng

(57) ABSTRACT

A four-junction quaternary compound solar cell and a method thereof are provided. Forming a first subcell (100) with a first band gap, a lattice constant matching with the substrate on an InP grown substrate, forming a second subcell (200) with a second band gap bigger than the first band gap, a lattice constant matching with the substrate on the first subcell, forming a graded buffer layer (600) with a third band gap bigger than the second band gap on the second subcell, forming a third subcell (300) with a fourth band gap bigger than the third band gap, a lattice constant smaller than the substrate on the graded buffer layer, forming a fourth subcell (400) with a fifth band gap bigger than the fourth band gap, a lattice constant matching with the third subcell on the third subcell, and then forming the required four-junction solar cell then by succeeding process including removing the grown substrate, bonding a support substrate, forming electrodes, evaporating an anti-reflect film and so on.

12 Claims, 7 Drawing Sheets

(56) References Cited

FOREIGN PATENT DOCUMENTS

| CN | 102270693 | 12/2011 |
|---|---|---|
| CN | 102299159 | 12/2011 |
| CN | 102569475 | 7/2012 |

OTHER PUBLICATIONS

International Preliminary Report on Patentability for International Application No. PCT/CN2012/087150 "Four-Junction Quarternary Compound Solar Cell and Method Thereof," Date of Mailing: Aug. 12, 2014.

\* cited by examiner

| 011 |
|---|
| 801 |
| 700 |
| 404 |
| 403 |
| 402 |
| * |
| * |
| * |
| 102 |
| 101 |
| 020 |
| 010 |

Fig. 4

| 011 |
|---|
| 801 |
| 700 |
| 404 |
| 403 |
| 402 |
| ∗ |
| ∗ |
| ∗ |
| 102 |
| 101 |
| 020 |
| 802 |
| 012 |

FOUR-JUNCTION QUATERNARY COMPOUND SOLAR CELL AND METHOD THEREOF

This application is the U.S. National Stage of International Application No. PCT/CN2012/087150, filed Dec. 21, 2012, which designates the U.S., published in Chinese, and claims priority under 35 U.S.C. 119 or 365(c) to Chinese Patent Application No. 201210026736.7, filed Feb. 8, 2012. The entire teachings of the above applications are incorporated herein by reference.

FIELD OF THE INVENTION

The present invention relates to a four-junction quaternary compound solar cell and fabrication method thereof, which pertains to the semiconductor material field.

BACKGROUND OF THE INVENTION

In recent years, solar cell has attracted increasingly more attention as a practical new energy. It is a semiconductor device that converts solar energy to electrical energy using the photovoltaic effect, which greatly reduces the dependence of human production and life on coal, petroleum and natural gas, and becomes one of the most effective methods utilizing green energy sources. Among all new energies, solar energy is one of the most ideal renewal energies. Thorough development and utilization of solar energy have become an energy strategic decision made by all governments in the world for sustainable development. Over recent years, with the development of concentrating photovoltaic technology (CPV), an increasing attention has been paid to the III-V compound semiconductor solar cell due to its high photoelectric conversion efficiency.

For the III-V compound semiconductor field, the epitaxial growth of a lattice matching GaInP/GaAs/Ge triple junction solar cell on a Ge substrate is a relatively mature technology, for its conversion efficiency is as high as 41%. In the lattice matching GaInP/GaAs/Ge three junction solar cell, with the cell band gap of the Ge substrate at 0.66 eV and AM1.5D, the photocurrent density $J_{ph}$ is about 27.0 mA/cm$^2$, which is twice as much as the photocurrent of the GaInP/GaAs/Ge triple-junction stacked solar cell. However, mismatching current may reduce efficiency of the Ge substrate cell since the working current of the multi junction solar cell is determined by the one with the minimum short-circuit current among the subcells. One of the effective methods to solve this problem right now is to further insert an InGaNAs subcell that has a lattice matching the Ge substrate and the GaAs material and has a band gap of about 1.0 eV between the center cell and the substrate cell, thereby obtaining an InGaP/GaAs/InGaNAs/Ge four-junction solar cell. This can make the current more matching than in the three junction solar cell. Moreover, the increase of the junction number can make the Sun spectrum to be divided in higher resolution and increase the efficiency. Due to the very low solid solubility of N atoms in the InGaAs material, however, there is a high defect density and overly short life and diffusion length of photo-induced carriers, which makes it difficult to meet the high quality requirement by solar cells. As a result, the efficiency of the InGaP/GaAs/InGaNAs/Ge four-junction solar cell is far lower than that of the three junction solar cell instead. Since the crystal quality of InGaNAs is limited by the material itself, the InGaP/GaAs/InGaNAs/Ge four-junction solar cell can be successful only when breakthroughs are achieved on material growth. Therefore, the development of a novel four-junction solar cell device that can take the place of the InGaP/GaAs/InGaNAs/Ge four-junction solar cell has become the key for further improvement of the III-V solar cell efficiency.

SUMMARY OF THE INVENTION

To solve the above problems of the prior art, this invention discloses a four-junction quaternary compound solar cell and its fabrication method.

According to a first aspect of this invention, a four-junction quaternary compound solar cell is disclosed, including an InP substrate; a first subcell having a lattice constant matched with the substrate that forms on the substrate with a first band gap; a second subcell having a lattice constant matched with the substrate that forms on the first subcell, and it has a second band gap larger than the first band gap; a graded buffer layer having a third band gap larger than the second band gap that forms on the second subcell. The component in this layer gradually changes and the lattice constant is gradually reduced along with the component change; a third subcell having a fourth band gap larger than the third band gap that forms on the graded buffer layer and its lattice constant is less than those of the substrate and the first and second subcells; and a fourth subcell having a fifth band gap larger than the fourth band gap that forms on the third subcell and its lattice constant is matched with that of the third subcell.

More particularly, the first subcell is composed of an InGaAs emitter region and a base with a band gap of 0.72-0.76 eV; the second subcell is composed of a quaternary compound InGaAsP emitter region and a base with a band gap of 1-1.1 eV; the graded buffer layer is InGaP and its lattice constant changing along with the In component ratio is matched with the growth substrate lattice at one side and with the third subcell lattice at the other side; the third subcell is composed of a quaternary compound InAlGaAs emitter region and a base with a band gap of 1.35-1.42 eV; and the fourth subcell is composed of a quaternary compound InAlAsP emitter region and a base with a band gap of 1.85-1.92 eV.

According to a second aspect of this invention, a four-junction quaternary compound solar cell is disclosed, including a supporting substrate; a first subcell with a first band gap on the supporting substrate; a second subcell having a second band gap larger than the first band gap and a lattice constant matched with the first subcell on the first subcell, and it is composed of a quaternary compound InGaAsP emitter region and a base; a graded buffer layer having a third band gap larger than the second band gap on the second subcell. The component in this layer gradually changes and the lattice constant is gradually reduced along with the component change; a third subcell composed of a quaternary compound InAlGaAs emitter region and a base on the graded buffer layer, and its fourth band gap is larger than the third band gap and the lattice constant is less than those of the first and second subcells; and a fourth subcell composed of a quaternary compound InAlAsP emitter region and a base on the third subcell, and its fifth band gap is larger than the fourth band gap and the lattice constant is matched with that of the third subcell.

More particularly, the first subcell is composed of an InGaAs emitter region and a base with a band gap of 0.72-0.76 eV; the second subcell is composed of a quaternary compound InGaAsP emitter region and a base with a band gap of 1-1.1 eV; the graded buffer layer is InGaP and its lattice constant changing along with the In component ratio is matched with the growth substrate lattice at one side and with the third subcell lattice at the other side; the third subcell is composed of a quaternary compound InAlGaAs emitter region and a base with a band gap of 1.35-1.42 eV; and the fourth subcell is composed of a quaternary compound InAlAsP emitter region and a base with a band gap of 1.85-1.92 eV.

According to a third aspect of this invention, a fabrication method of the four-junction quaternary compound solar cell is disclosed, including the following steps: providing an InP growth substrate; forming a first subcell on the growth substrate having a first band gap and a lattice constant matched with the growth substrate lattice; forming a second subcell on the first subcell having a second band gap larger than the first band gap and a lattice constant matched with the substrate lattice; forming a graded buffer layer on the second subcell having a third band gap larger than the second band gap with gradually changed component; forming a third subcell on the graded buffer layer having a fourth band gap larger than the third band gap and a lattice constant less than the substrate lattice constant; and forming a fourth subcell on the third subcell having a fifth band gap larger than the fourth band gap and a lattice constant matched with the third subcell.

More particularly, form an InGaAs first subcell with a lattice matched with the InP substrate and a band gap of 0.72-0.76 eV on the substrate; form an InGaAsP second subcell with a lattice matched with the InP substrate and a band gap of 1-1.1 eV on the first subcell; form an InGaP graded buffer layer with gradually-changed component on the second subcell, and its lattice constant, matched with the growth substrate lattice at one side, is changed along with the In component ratio change and gradually reduces; form an InAlGaAs third subcell with a lattice matched with the top of the graded buffer layer and a band gap of 1.35-1.42 eV on the graded buffer layer; and form a fourth subcell with a lattice matched with the third subcell lattice and a band gap of 1.85-1.92 eV on the third subcell.

After completing the epitaxial growth steps of the four-junction solar cell, treat the chip according to the following steps: providing a temporary substrate and reversely pasting the completed four-junction quaternary compound solar cell on the temporary substrate; lifting off the InP growth substrate; providing a supporting substrate and bonding with the four-junction quaternary compound solar cell; removing the temporary substrate and completing the process of the four-junction quaternary compound solar cell.

For the quaternary semiconductor compound $III^1_x III^2_{1-x} V^1_y V^2_{1-y}$ composed of III-V elements, by changing the chemical ratios x and y among the elements, either different band gaps under same lattice constant or different lattice constants under same band gap are available, thus effectively broadening the application range of the III-V semiconductor heterojunction. This invention takes advantage of the quaternary compound characteristics, and desired lattice constants and band gaps are obtained by regulating chemical ratio of the elements so that a suitable 1 eV subcell is found. In addition, the graded buffer layer gradually releases the stress from lattice mismatch between the first/second subcell and the third/fourth subcell, thus effectively reducing the dislocation density. Moreover, owing to substrate lift-off technology, the expensive InP growth substrate is recycled for usage and the production cost is therefore reduced.

In the four-junction quaternary compound solar cell disclosed in this invention, gradual increase of the band gap broadens the solar spectral absorption range to a larger extent and improves the cell efficiency.

Other features and advantages of this invention will be described in the following description, and moreover, will be partially obvious through the description or understood through the implementation of this invention. The objects and other advantages of this invention may be attained and achieved with the structure specifically described in the description, claims and accompanying drawings.

BRIEF DESCRIPTION OF THE DRAWINGS

The accompanying drawings are provided for further understanding of this invention and form a part of the description, which are used together with the embodiments of this invention to describe this invention, instead of to limit this invention. Moreover, data in the accompanying drawings are a description summary and not drawn to scale.

FIGS. 3-7 are schematic diagrams of a fabrication process of the four-junction quaternary compound solar cell embodied according to this invention, wherein, FIG. 3 is a structural diagram of the four-junction quaternary compound solar cell after the epitaxial growth is completed; FIG. 4 is a structural diagram of the four-junction quaternary compound solar cell after pasting the temporary substrate; FIG. 5 is a structural diagram of the four-junction quaternary compound solar cell after the growth substrate is etched; FIG. 6 is a structural diagram of the four-junction quaternary compound solar cell after bonding the supporting substrate; and FIG. 7 is a structural diagram of the four-junction quaternary compound solar cell after lifting off the temporary substrate.

Numbers in the figures represent:
010: growth substrate;
011: temporary substrate;
012: supporting substrate;
020: etching stop layer ESL
100: first subcell;
101: back surface field layer of the first subcell;
102: base of the first subcell;
103: emitter layer of the first subcell;
104: window layer of the first subcell;
200: second subcell;
201: back surface field layer of the second subcell;
202: base of the second subcell;
203: emitter layer of the second subcell;
204: window layer of the second subcell;
300: second subcell;
301: back surface field layer of the third subcell;
302: base of the third subcell;
303: emitter layer of the third subcell;
304: window layer of the third subcell;
400: fourth subcell;
401: back surface field layer of the fourth subcell;
402: base of the fourth subcell;
403: emitter layer of the fourth subcell;
403: window layer of the fourth subcell;
501: tunnel junctions of the first and second subcells;
502: tunnel junctions of the second and third subcells;
503: tunnel junctions of the third and fourth subcells;
600: graded buffer layer;
700: cap layer;
801: bonding layer;
802: bonding layer.

SPECIFIC EMBODIMENTS

The details of the invention, including the demonstrations and embodiments, will be described as follows by referring to the diagrams and descriptions below. The same reference numbers denote the elements of same or similar functions and the highly-simplified graphic modes are used to illustrate the main characteristics of the demonstrative embodiments. Moreover, the drawings are not intended to depict every feature of the actual embodiments or relative dimensions of the depicted elements, and the drawings are not drawn to scale.

Embodiment 1

Figure 1:
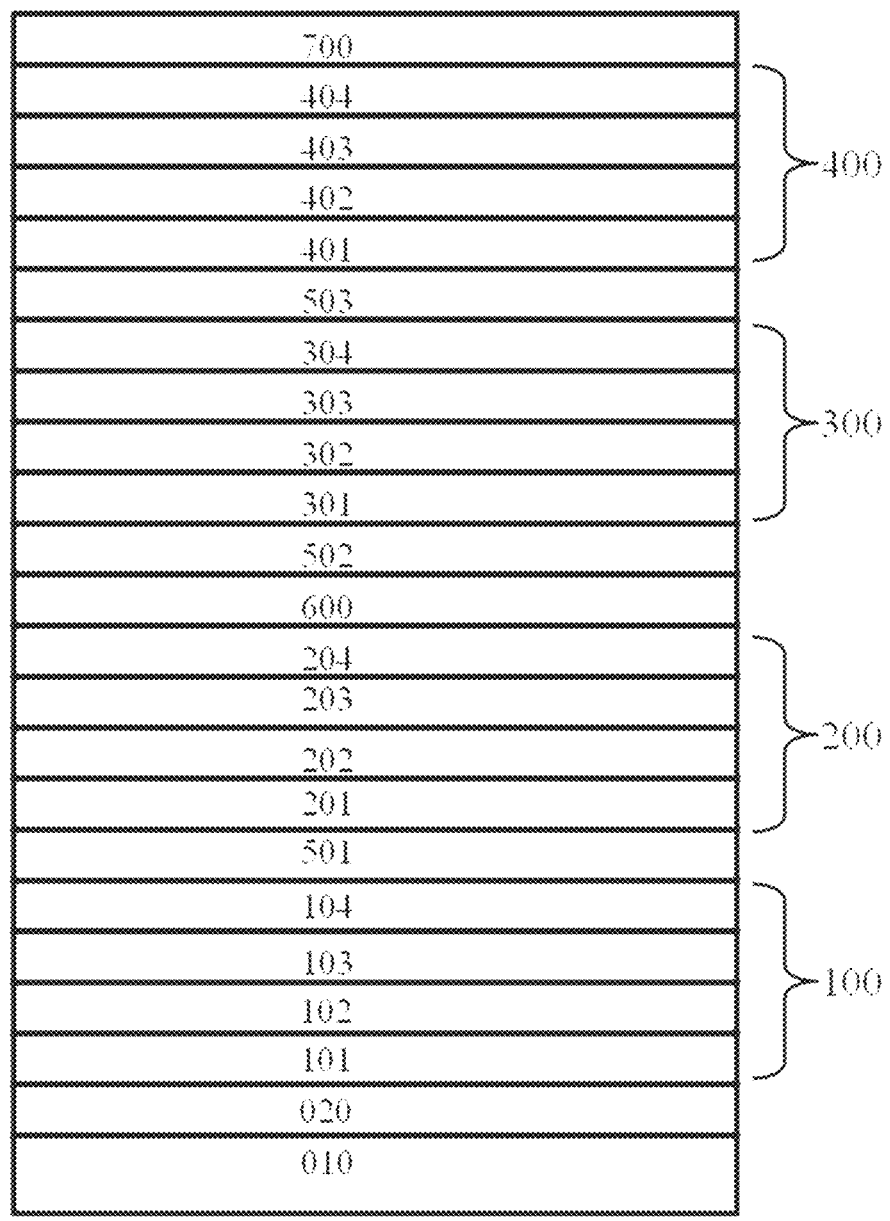
FIG. 1 is a structural diagram of a first four-junction quaternary compound solar cell embodied according to this invention.

Referring to FIG. 1, a four-junction quaternary compound solar cell comprises an InP growth substrate 010, a first subcell 100, a second subcell 200, a graded buffer layer 600, a third subcell 300 and a fourth subcell 400, wherein, the subcells of each junction are connected by tunnel junctions 501, 502 and 503. Detailed structures are described below.

The growth substrate 010 preferably selects a 200 um p-type InP substrate with a doping concentration of $2 \times 10^{17}$ $cm^{-3} \times 10^{17}$ $cm^{-3}$.

An etching stop layer ESL 020 about 500 nm thick is formed on the growth substrate for lifting off the substrate later.

A first subcell 100 is formed on the etching stop layer ESL 020, having a lattice constant matched with the growth substrate and a band gap about 0.75. The first subcell comprises a back surface field layer 101, a base 102, an emitter layer 103 and a window layer 104. In this embodiment, the back surface field layer 101 is a p-type InGaAsP, the component ratio of which ensures lattice constant matching with the substrate. The thickness is 100 nm and the doping concentration is $1 \times 10^{18}$ $cm^{-3}$–$2 \times 10^{18}$ $cm^{-3}$; the base 102 is a p-type $In_xGa_{1-x}As$ with a band gap of 0.65 eV. The thickness, preferably, is 3.5 um. By gradual doping, the concentration is $1.5 \times 10^{17}$ $cm^{-3}$–$5 \times 10^{17}$ $cm^{-3}$; the emitter layer 103 is an n-type $In_xGa_{1-x}As$ of 100 nm thick having a doping concentration of $2 \times 10^{18}$ $cm^{-3}$; and the window layer 104 is an n-type $Al_xIn_yGa_{1-x-y}As$ of 25 nm thick having a doping concentration of about $1 \times 10^{18}$ $cm^{-3}$.

A tunnel junction 501 of the first and second subcells is formed on the n-type window layer 104 at the top of the first subcell 100, composed of a series of P++—$GaAs_xP_{1-x}$/n++—$GaAs_xP_{1-x}$. With a doping concentration of $2 \times 10^{19}$ $cm^{-3}$, this tunnel junction about 50 nm thick is used for connecting the first subcell 100 to the second subcell 200.

A second subcell 200 is formed on the tunnel junction 501, having a lattice constant matched with the growth substrate and a band gap of 1-1.1 eV. The second subcell comprises a back surface field layer 201, a base 202, an emitter layer 203 and a window layer 204. In this embodiment, the back surface field layer 201 is $Al_xIn_yGa_{1-x-y}As$, and the thickness and doping concentration are 100 nm and $1 \times 10^{18}$ $cm^{-3}$–$2 \times 10^{18}$ $cm^{-3}$ respectively. The selection of x and y ensures its lattice constant matching with the InP growth substrate; the base 202 is p+—$In_xGa_{1-x}As_yP_{1-y}$ with a band gap of 1 eV. The thickness, preferably, is 3 um. By gradual doping, the concentration is $1.5 \times 10^{17}$ $cm^{-3}$–$5 \times 10^{17}$ $cm^{-3}$; the emitter layer 203 is n+—$In_xGa_{1-x}As_yP_{1-y}$ of 100 nm thick having a doping concentration of $2 \times 10^{18}$ $cm^{-3}$; and the window layer 204 is an n-type $GaAs_xP_{1-x}$ of 25 nm thick having a doping concentration of about $1 \times 10^{18}$ $cm^{-3}$.

A graded buffer layer 600 $In_zGa_{1-z}P$ is formed on the window layer 204 at the top of the second subcell 200. By changing the In component z, this layer gradually reduces the lattice constant. At first, the lattice constant of this layer is matched with the lattice constant of the growth substrate and gradually, with that of the third subcell. In this embodiment, the graded buffer layer has 8 layers. The lattice constant is changed from 0.58 nm to 0.566 nm. Furthermore, the doping concentration is $1-2 \times 10^{18}$ $cm^{-3}$. The dislocation density is effectively reduced by gradual release of stress.

A tunnel junction 502 of the second and third subcells is formed on the graded buffer layer 600, composed of a series of P++—GaAs/n++—GaAs. With a doping concentration of $2 \times 10^{19}$ $cm^{-3}$, this tunnel junction about 50 nm thick is used for connecting the second subcell 200 to the third subcell 300.

A third subcell 300 is formed on the tunnel junction 502, having a lattice constant matched with the lattice constant at the top of the graded buffer layer 600 and a band gap of 1.35-1.42 eV. The third subcell 300 comprises a back surface field layer 301, a base 302, an emitter layer 303 and a window layer 304. In this embodiment, the back surface field layer 301 is $Al_xGa_{1-x}As$, and the thickness and doping concentration are 100 nm and $1 \times 10^{18}$ $cm^{-3}$–$2 \times 10^{18}$ $cm^{-3}$ respectively. The selection of x ensures its lattice matching with the top of the graded buffer layer 600; the base 302 is p+—$In_xAl_yGa_{1-x-y}As$ with a band gap of 1.42 eV. The thickness, preferably, is 2.5 um. By gradual doping, the concentration is $1.5 \times 10^{17}$ $cm^{-3}$–$5 \times 10^{17}$ $cm^{-3}$; the emitter layer 303 is n+—$In_xAl_yGa_{1-x-y}As$ of 100 nm thick having a doping concentration of $2 \times 10^{18}$ $cm^{-3}$; and the window layer 304 is an n-type $Al_xIn_{1-x}P$ of 25 nm thick having a doping concentration of about $1 \times 10^{18}$ $cm^{-3}$.

A tunnel junction 503 of the third and fourth subcells is formed on the window layer 304 at the top of the third subcell 300, composed of a series of p++—$Al_xGa_{1-x}As$/n++—GaAs. With a doping concentration of $2 \times 10^{19}$ $cm^{-3}$, this tunnel junction about 50 nm thick is used for connecting the third subcell 300 to the fourth subcell 400.

A fourth subcell 400 is formed on the tunnel junction 503, having a lattice constant matched with the third subcell and a band gap of 1.85-1.92 eV. The fourth subcell 400 comprises a back surface field layer 401, a base 402, an emitter layer 403 and a window layer 404. In this embodiment, the back surface field layer 401 is p+—$Al_xGa_{1-x}As_yP_{1-y}$, and the thickness and doping concentration are 100 nm and $1 \times 10^{18}$ $cm^{-3}$–$2 \times 10^{18}$ $cm^{-3}$ respectively. The selection of x ensures its lattice matching with the third subcell; the base 402 is p+—$In_xAl_{1-x}As_yP_{1-y}$ with a band gap of 1.89 eV. The thickness, preferably, is 1 um. By gradual doping, the concentration is $1.5 \times 10^{17}$ $cm^{-3}$–$5 \times 10^{17}$ $cm^{-3}$; the emitter layer 403 is n+—$In_xAl_{1-x}As_yP_{1-y}$ of 100 nm thick having a doping concentration of $2 \times 10^{18}$ $cm^{-3}$; and the window layer 404 is an n-type $Al_xIn_{1-x}P$ of 25 nm thick having a doping concentration of about $1 \times 10^{18}$ $cm^{-3}$.

A cap layer 700 is formed on the window layer 404 at the top of the fourth subcell 400 composed of n++—GaAs. The thickness and doping concentration are 500 nm and about $2 \times 10^{19}$ $cm^{-3}$ respectively.

This invention discloses a four-junction solar cell structure on the InP substrate. By taking advantage of the quaternary compound characteristics, desired lattice constants and band gaps are obtained by regulating chemical ratio of the elements so that a suitable 1 eV subcell is found. Therefore, a four-junction quaternary compound solar cell having a gradually-increased band gap is formed, which broadens the solar spectral absorption range to a larger extent and improves the cell efficiency. In addition, the graded buffer layer gradually releases the stress from lattice mismatch between the first/second subcell and the third/fourth subcell, thus effectively reducing the dislocation density.

Embodiment 2

Figure 2:
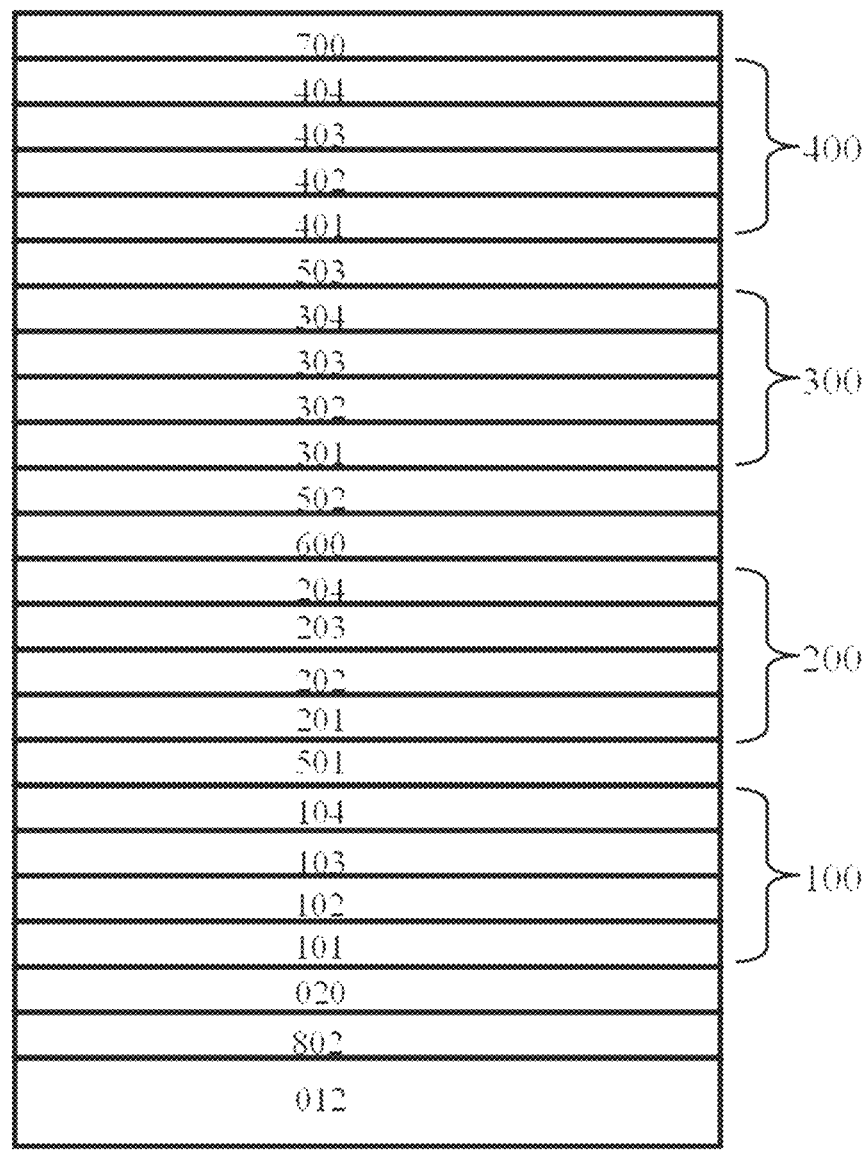
FIG. 2 is a structural diagram of a second four-junction quaternary compound solar cell embodied according to this invention.

FIG. 2 shows a four-junction quaternary compound solar cell structure. Different from the solar cell in Embodiment 1, the InP growth substrate of the solar cell in FIG. 1 is replaced by a supporting substrate 012 in this embodiment and connected by a bonding layer 802. In consideration of high cost of the InP growth substrate, this embodiment combines the growth substrate lifting off process with the supporting bonding process to achieve recycling usage of the InP growth substrate.

Embodiment 3

This embodiment is the preparation process of the high-concentration multi junction solar cells in Embodiment 1 and Embodiment 2, including the forming process of the subcells 100, 200, 300 and 400 and layers among subcells, growth substrate lifting off process and supporting substrate bonding process.

The lattice constants and electrical properties in the semiconductor structure are controlled by appropriate chemical components and doping agents under suitable growth temperature and within suitable growth time. The growth technology of this invention can be vapor deposition method like MOCVD and MBE, and preferably, MOCVD.

The detailed preparation technology comprises the following steps:

Firstly, provide an InP growth substrate 010. Clean the InP substrate 1 at 9 degrees of deflection angle to the (001) surface and put it into the organic metal chemical vapor deposition reaction chamber. Bake it under 750° C. for 10 minutes. In this embodiment, the growth substrate 010, preferably, is a 200 um-thick p-type InP substrate with a doping concentration of $2\times10^{17}$ cm$^{-3}$–$5\times10^{17}$ cm$^{-3}$.

Next, deposit a 500 nm-thick etching stop layer 020 on the substrate 010 with a doping concentration of $1\times10^{18}$ cm$^{-3}$ for lifting off the substrate later.

Next, form a first subcell 100 above the etching stop layer 020 having a lattice constant matched with the growth substrate and a band gap of about 0.75. More particularly, deposit an Al$_x$In$_y$Ga$_{1-x-y}$As about 100 nm thick on the etching stop layer 020 as the back surface field layer 101 with a doping concentration of $1\times10^{18}$ cm$^{-3}$–$2\times10^{18}$ cm$^{-3}$; deposit a p+—In$_x$Ga$_{1-x}$As material layer about 3.5 um thick above the back surface field layer 101 as the first subcell base 102 with a band gap of 0.65 eV. By gradual doping, the concentration is $1.5\times10^{17}$ cm$^{-3}$–$5\times10^{17}$ cm$^{-3}$; deposit a 100 nm-thick n+—In$_x$Ga$_{1-x}$As material layer above the base 102 as the first subcell emitter region 103 with a doping concentration of $2\times10^{18}$ cm$^{-3}$; and deposit a 25 nm-thick n-type Al$_x$In$_y$Ga$_{1-x-y}$As material layer on the surface of the emitter region 103 as the first subcell window layer 104 with a doping concentration about $1\times10^{18}$ cm$^{-3}$. Now, the first subcell 100 is formed.

Next, deposit a 50 nm-thick P++—GaAs$_x$P$_{1-x}$/n++—GaAs$_x$P$_{1-x}$ series material layer as the tunnel junction 501 of the first and second subcells with a doping concentration of $2\times10^{19}$ cm$^{-3}$ above the first subcell window layer 104.

Next, form a second subcell via epitaxial growth above the tunnel junction 501 of the first and second subcells having a lattice constant matched with the growth substrate and a band gap of 1-1.1 eV. More particularly, deposit a 100 nm-thick Al$_x$In$_y$Ga$_{1-x-y}$As material layer above the tunnel junction 501 as the back surface field layer 201 with a doping concentration of $1\times10^{18}$ cm$^{-3}$–$2\times10^{18}$ cm$^3$; deposit a 3 um-thick p+—In$_x$Ga$_{1-x}$As$_y$P$_{1-y}$ material layer above the back surface field layer 050 as the second subcell base 202 with a band gap of 1 eV. By gradual doping, the concentration is $1.5\times10^{17}$ cm$^{-3}$–$5\times10^{17}$ cm$^{-3}$; deposit a 100 nm-thick n+—In$_x$Ga$_{1-x}$As$_y$P$_{1-y}$ material layer above the base 202 as the second subcell emitter region 203 with a doping concentration of $2\times10^{18}$ cm$^{-3}$; and deposit a 25 nm-thick n-type GaAs$_x$P$_{1-x}$ layer on the surface of the emitter region 203 as the second subcell window layer 204 with a doping concentration about $1\times10^{18}$ cm$^{-3}$. Now, the second subcell 200 is formed.

Next, form an In$_x$Ga$_{1-x}$P graded buffer layer 600 via epitaxial growth above the second subcell window layer 204. Change the In component x value to reduce the lattice constant from 0.58 nm to 0.566 nm. This graded buffer layer has 8 layers and the doping concentration is $1\times10^{18}$ cm$^{-3}$–$2\times10^{18}$ cm$^{-3}$. The dislocation density is reduced by gradual release of stress.

Next, deposit a 50 nm-thick P++—GaAs/n++—GaAs series material layer as the tunnel junction 502 of the second and third subcells with a doping concentration of $2\times10^{19}$ cm$^{-3}$ above the graded buffer layer 600.

Next, form a third subcell via epitaxial growth above the tunnel junction 502 of the second and third subcells having a lattice constant matched with the lattice constant at the top of the graded buffer layer 600 and a band gap of 1.35-1.42 eV. More particularly, deposit a 100 nm-thick Al$_x$Ga$_{1-x}$As material layer above the tunnel junction 502 as the back surface field layer 301 of the third subcell with a doping concentration of $1\times10^{18}$ cm$^{-3}$–$2\times10^{18}$ cm$^{-3}$; deposit a 2.5 um-thick p+—In$_x$Al$_y$Ga$_{1-x-y}$As material layer above the back surface field layer 301 of the third subcell as the third subcell base 302 with a band gap of 1.42 eV. By gradual doping, the concentration is $1.5\times10^{17}$ cm$^{-3}$–$5\times10^{17}$ cm$^{-3}$; deposit a 100 nm-thick n+—In$_x$Al$_y$Ga$_{1-x-y}$As material layer above the base 302 as the third subcell emitter region 303 with a doping concentration of $2\times10^{18}$ cm$^3$; and deposit a 25 nm-thick n-type Al$_x$In$_{1-x}$P material layer on the surface of the emitter region 303 as the third subcell window layer 304 with a doping concentration about $1\times10^{18}$ cm$^{-3}$. Now, the third subcell 300 is formed.

Next, deposit a 50 nm-thick p++—Al$_x$Ga$_{1-x}$As/n++—GaAs series material layer as the tunnel junction 503 of the third and fourth subcells with a doping concentration of $2\times10^{19}$ cm$^{-3}$ above the third subcell window layer 304.

Next, form a fourth subcell via epitaxial growth above the tunnel junction 503 of the third and fourth subcells having a lattice constant matched with the third subcell and a band gap of 1.85-1.92 eV. More particularly, deposit a 100 nm-thick p+—Al$_x$Ga$_{1-x}$As$_y$P$_{1-y}$ material layer above the tunnel junction 503 as the back surface field layer 401 of the third subcell with a doping concentration of $1\times10^{18}$ cm$^{-3}$–$2\times10^{18}$ cm$^{-3}$; deposit a p+—In$_x$Al$_{1-x}$As$_y$P$_{1-y}$ material layer about 1 um thick above the back surface field layer 401 of the fourth subcell as the fourth subcell base 402 with a band gap of 1.89 eV. By gradual doping, the concentration is $1.5\times10^{17}$ cm$^{-3}$–$5\times10^{17}$ cm$^{-3}$; deposit a 100 nm-thick n+—In$_x$Al$_{1-x}$As$_y$P$_{1-y}$ material layer above the base 402 as the fourth subcell emitter region 403 with a doping concentration of $2\times10^{18}$ cm$^3$; and deposit a 25 nm-thick n-type Al$_x$In$_{1-x}$P material layer on the surface of the emitter region 403 as the fourth subcell window layer 404 with a doping concentration about $1\times10^{18}$ cm$^{-3}$. Now, the fourth subcell is formed.

Figure 3:
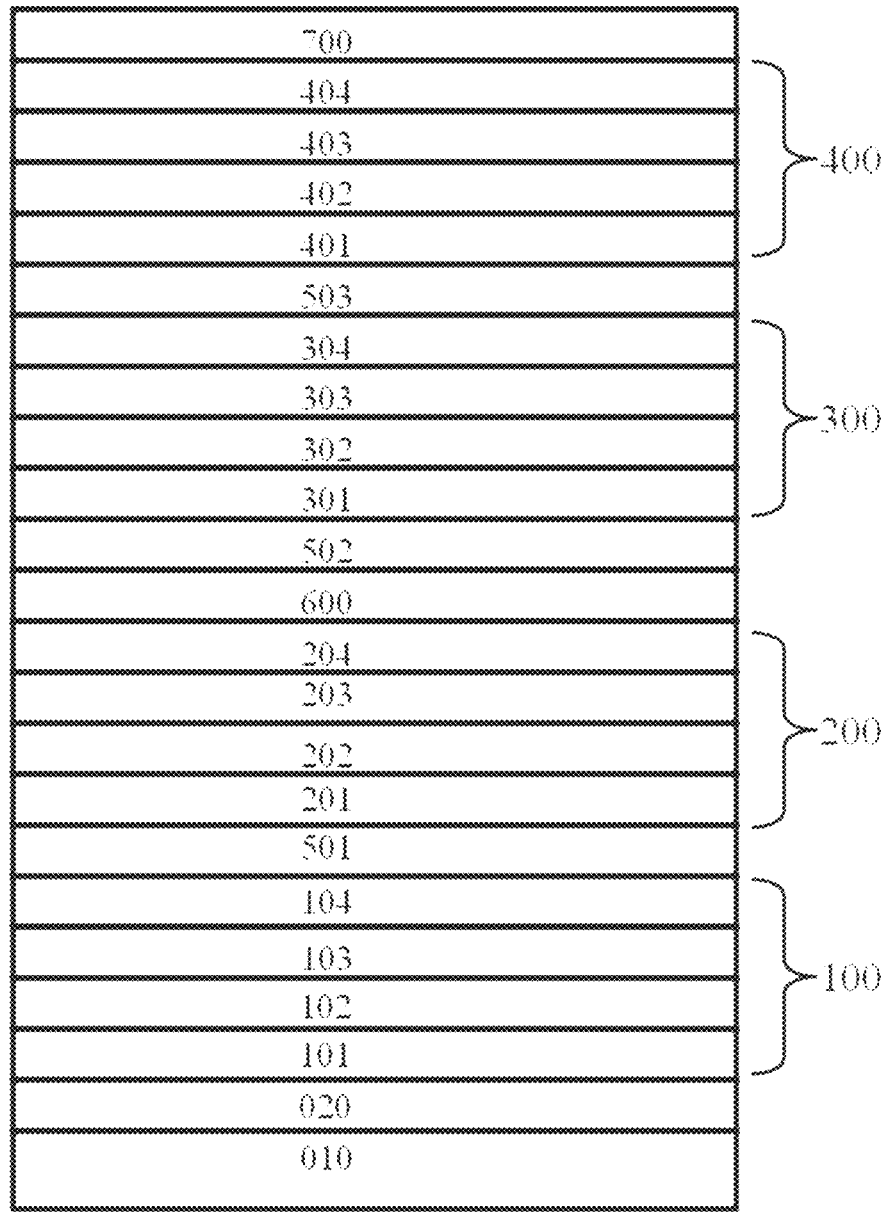

Next, deposit a high-doping n++—GaAs cap layer 110 via epitaxial growth above the fourth subcell window layer 404 of 500 nm thickness and about $2\times10^{19}$ cm$^{-3}$ doping concentration. Now, the epitaxial growth process of the four-junction quaternary compound solar cell is completed. Refer to FIG. 3 for the structural diagram.

Now, take out the sample after epitaxial growth for such later processes as substrate lifting off, supporting substrate bonding, electrode preparation and AR coating evaporation to finally form the desired high-efficient four-junction solar cell. The detailed processes are as follows.

Figure 4:
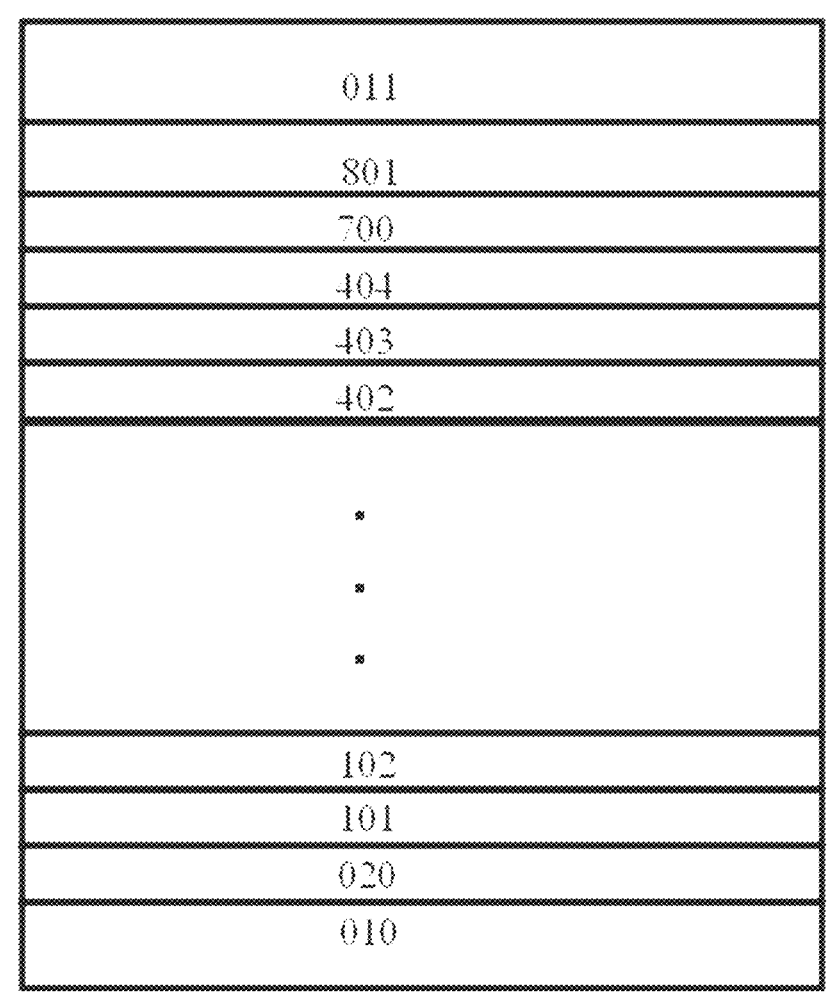

Firstly, take out a Si wafer as the temporary substrate 011 and reversely paste the completed four-junction quaternary compound solar cell on the temporary substrate 011 through the bonding layer 801. The bonding layer 801 can be labile material like epoxy resin. See FIG. 4 for the structural diagram of the four-junction quaternary compound solar cell after bonding the temporary substrate.

Figure 5:
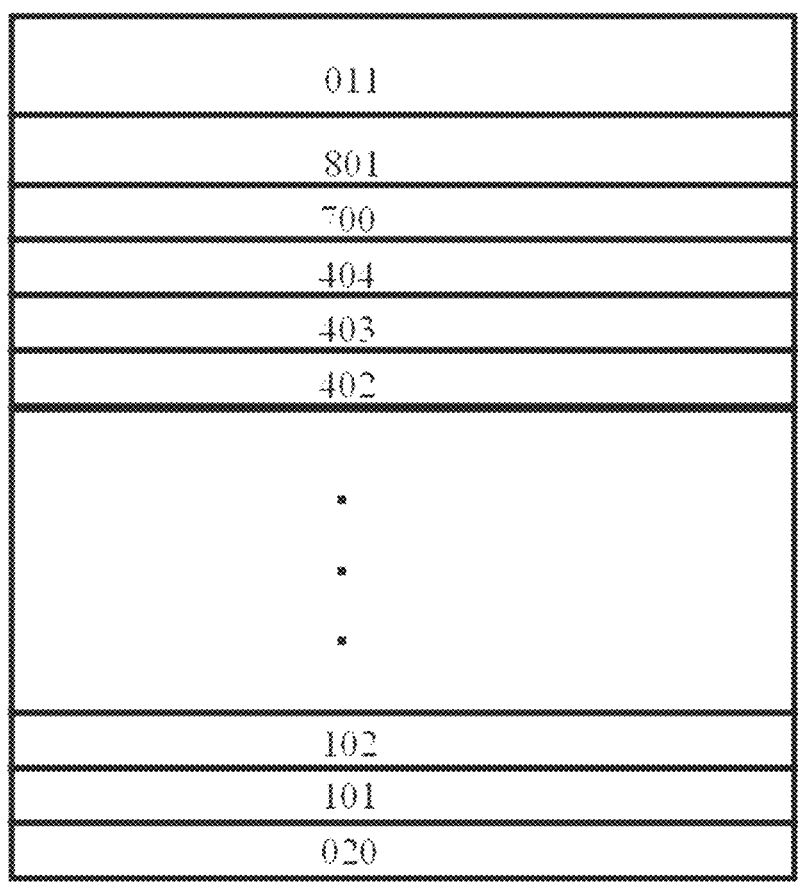

Next, lift off the InP growth substrate by etching process or others. See FIG. 5 for the structural diagram of the solar cell after lifting off the substrate.

Figure 6:
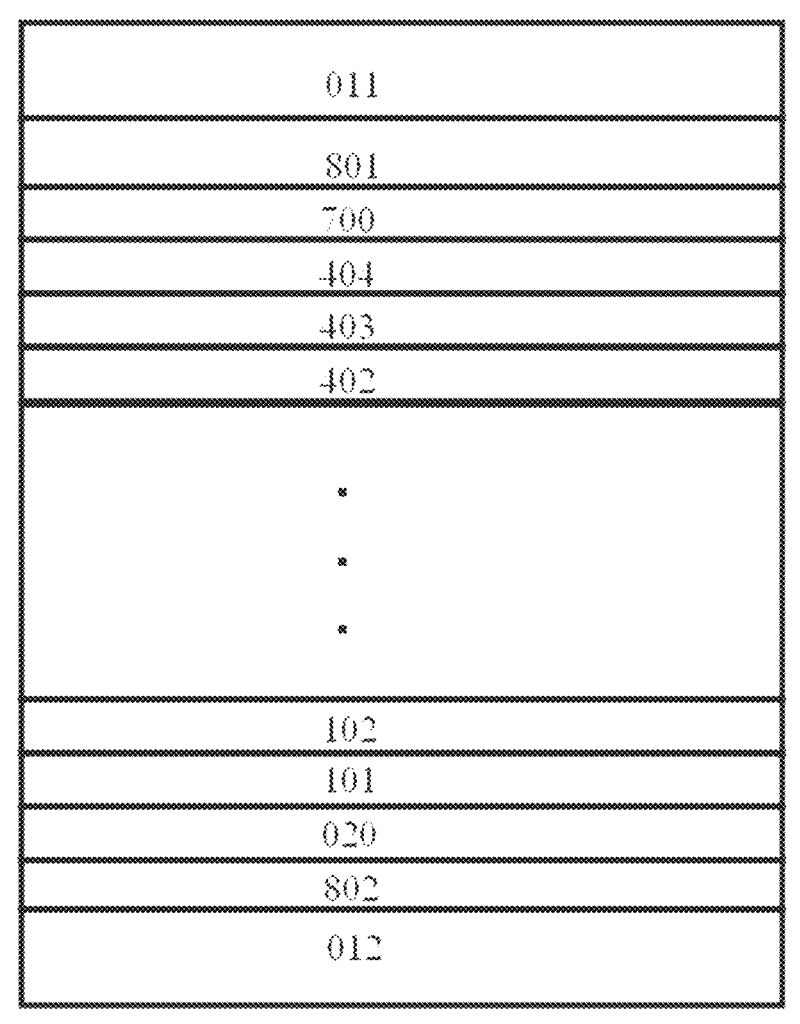

Next, provide a supporting substrate 012 and bond it with the completed four-junction quaternary compound solar cell. The supporting substrate 012 can be a Si wafer. Through the metal bonding layer 802, bond the supporting substrate with the lower end of the first subcell by the bonding process. See FIG. 6 for the structural diagram.

Figure 7:
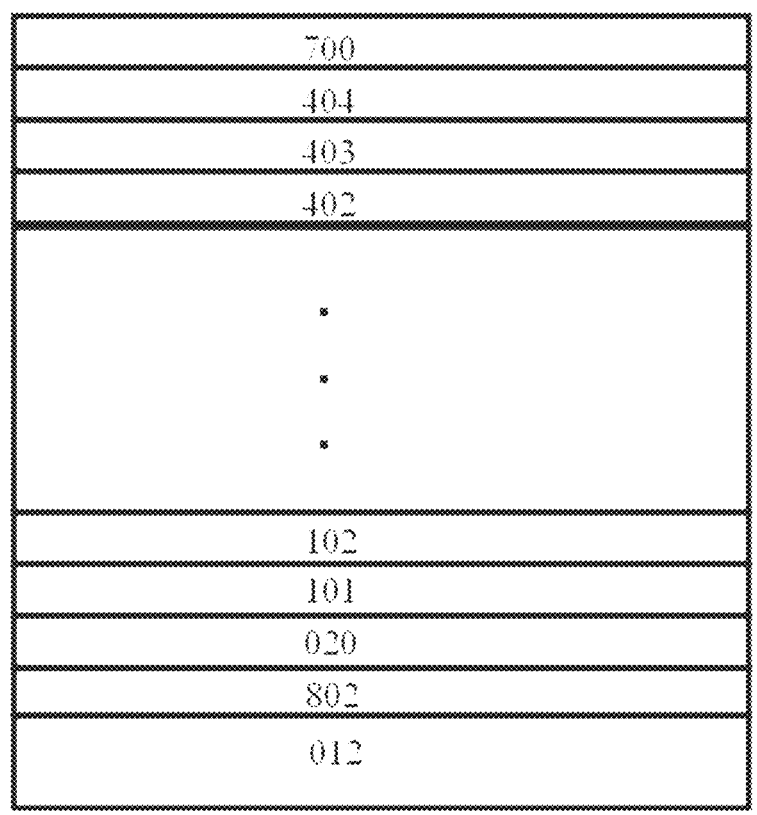

Next, remove the temporary substrate 011 to complete the process of the four-junction quaternary compound solar cell. See FIG. 7 for the structural diagram of the four-junction quaternary compound solar cell after the temporary substrate is lifted off.

Obviously, the description of this invention shall not be construed as being only limited to the above embodiments. Instead, it shall encompass all embodiments that use the concept of this invention.

The invention claimed is:

1. A four-junction quaternary compound solar cell, comprising:
   an InP growth substrate;
   a first subcell with a first band gap and a lattice constant matched with the substrate lattice that forms on the growth substrate;
   a second subcell with a second band gap larger than the first band gap and a lattice constant matched with the substrate lattice that forms on the first subcell;
   a graded buffer layer that forms on the second subcell with a third band gap larger than the second band gap; wherein the lattice constant is gradually reduced in the graded buffer layer formed on the second subcell as the concentration of a component in the graded buffer layer is gradually modified;
   a third subcell formed on the graded buffer layer has a fourth band gap larger than the third band gap and a lattice constant less than the lattice constant of the substrate, the first subcell and the second subcell; and
   a fourth subcell formed on the third subcell has a fifth band gap larger than the fourth band gap and a lattice constant matched with the lattice constant of the third subcell.

2. The four-junction quaternary compound solar cell according to claim 1, characterized in that: the first subcell is composed of an InGaAs emitter region and a base; the second subcell is composed of a quaternary compound InGaAsP emitter region and a base; the graded buffer layer is InGaP; the third subcell is composed of a quaternary compound InAlGaAs emitter region and a base; and the fourth subcell is composed of a quaternary compound InAlAsP emitter region and a base.

3. The four-junction quaternary compound solar cell according to claim 1, characterized in that: the first subcell has a band gap of 0.72-0.76 eV; the second subcell has a band gap of 1-1.1 eV; the third subcell has a band gap of 1.35-1.42 eV; and the fourth subcell has a band gap of 1.85-1.92 eV.

4. The four-junction quaternary compound solar cell according to claim 1, wherein the graded buffer layer is InGaP, and the component is the ration of In; and
   the lattice constant of the graded buffer layer is lattice matched with the growth substrate at a first side and lattice matched with the third subcell at a second side.

5. A four-junction quaternary compound solar cell, comprising:
   a supporting substrate;
   a first subcell on the supporting substrate with a first band gap;
   a second subcell with a second band gap on the first subcell, wherein the second subcell is composed of a quaternary compound InGaAsP emitter region and a base, the second band gap is larger than the first band gap, and a lattice constant of the second subcell is matched with a lattice constant of the first subcell;
   a graded buffer layer with a third band gap on the second subcell; wherein the third band gap is larger than the second band gap, the lattice constant is gradually reduced in the graded buffer layer on the second subcell as the concentration of a component in the graded buffer layer is gradually modified;
   a third subcell of a quaternary compound InAlGaAs emitter region and a base with a fourth band gap, on the graded buffer layer, wherein the fourth band gap is larger than the third band gap and a lattice constant of the third subcell is less than the lattice constant of the first and second subcells;
   a fourth subcell composed a quaternary compound InAlAsP emitter region and a base with a fifth band gap, on the third subcell, wherein the fifth band gap is larger than the fourth band gap and a lattice constant of the fourth subcell is matched with the lattice constant of the third subcell.

6. The four-junction quaternary compound solar cell according to claim 5, characterized in that: the first subcell is composed of an InGaAs emitter region and a base; the second subcell is composed of a quaternary compound InGaAsP emitter region and a base; the graded buffer layer is InGaP; the third subcell is composed of a quaternary compound InAlGaAs emitter region and a base; and the fourth subcell is composed of a quaternary compound InAlAsP emitter region and a base.

7. The four-junction quaternary compound solar cell according to claim 5, wherein the graded buffer layer is InGaP, and the component is the ratio of In; and
   the gradually reducing lattice constant of the graded buffer layer is lattice matched with the second subcell at a first side and lattice matched with the third subcell at a second side.

8. A fabrication method of the four-junction quaternary compound solar cell, comprising the following steps:
   providing an InP growth substrate;
   forming a first subcell with a first band gap and a lattice constant matched with the substrate lattice on the growth substrate;

forming a second subcell with a second band gap larger than the first band gap and a lattice constant matched with the substrate lattice on the first subcell;

forming a graded buffer layer with a third band gap larger than the second band gap on the second subcell; and a concentration of a component in the graded buffer layer gradually changes;

forming a third subcell, on the graded buffer layer, wherein the fourth band gap is larger than the third band gap and a lattice constant of the third subcell is less than a lattice constant of the substrate; and forming a fourth subcell with a fifth band gap, on the third subcell, wherein the fifth band gap is larger than the fourth band gap and a lattice constant of the fourth subcell is lattice matched with the third subcell.

9. The fabrication method of the four-junction quaternary compound solar cell according to claim 8, characterized in that: the first subcell has a band gap of 0.62-0.76 eV; the second subcell has a band gap of 1-1.1 eV; the third subcell has a band gap of 1.35-1.42 eV; and the fourth subcell has a band gap of 1.85-1.92 eV.

10. The fabrication method of the four-junction quaternary compound solar cell according to claim 8, characterized in that: the first subcell is composed of an InGaAs emitter region and a base; the second subcell is composed of a quaternary compound InGaAsP emitter region and a base; the graded buffer layer is InGaP; the third subcell is composed of a quaternary compound InAlGaAs emitter region and a base; and the fourth subcell is composed of a quaternary compound InAlAsP emitter region and a base.

11. The fabrication method of the four-junction quaternary compound solar cell according to claim 8, characterized in that a lattice constant of the graded buffer layer is lattice matched with the growth substrate on a first side and is lattice matched with the third subcell on a second side.

12. The fabrication method of the four-junction quaternary compound solar cell according to claim 8, characterized in that the fabrication method further comprises the following steps:

providing a temporary substrate to reversely bond the completed four-junction quaternary compound solar cell on the temporary substrate;

lifting off the InP growth substrate;

providing a supporting substrate to bond the four-junction quaternary compound solar cell; and removing the temporary substrate to complete the process of the four-junction quaternary compound solar cell.

* * * * *